United States Patent [19]

Deckman et al.

[11] Patent Number: 4,554,727
[45] Date of Patent: Nov. 26, 1985

[54] METHOD FOR MAKING OPTICALLY ENHANCED THIN FILM PHOTOVOLTAIC DEVICE USING LITHOGRAPHY DEFINED RANDOM SURFACES

[75] Inventors: Harry W. Deckman, Clinton; Horst Witzke, Flemington; Christopher Wronski, Princeton; Eli Yablonovitch, Scotch Plains, all of N.J.

[73] Assignee: Exxon Research & Engineering Company, Florham Park, N.J.

[21] Appl. No.: 612,669

[22] Filed: May 22, 1984

Related U.S. Application Data

[63] Continuation-in-part of Ser. No. 405,075, Aug. 4, 1982, abandoned.

[51] Int. Cl.[4] ............................................. H01L 31/18
[52] U.S. Cl. ..................................... 29/572; 136/258; 136/259
[58] Field of Search ..................... 136/258 AM, 259; 156/643, 647; 430/313, 319, 5, 322, 323; 29/572; 204/192 E

[56] References Cited

U.S. PATENT DOCUMENTS

| 4,229,233 | 10/1980 | Hansen et al. | 204/192 E |
| 4,284,689 | 8/1981 | Craighead et al. | 204/192 E |
| 4,328,390 | 5/1982 | Meakin et al. | 136/259 |
| 4,344,996 | 8/1982 | Banks et al. | 204/192 E |

FOREIGN PATENT DOCUMENTS

| 3023165 | 1/1982 | Fed. Rep. of Germany | 136/259 |
| 55-108780 | 8/1980 | Japan | 136/259 |
| 57-49278 | 3/1982 | Japan | 136/258 AM |

*Primary Examiner*—Brian E. Hearn
*Assistant Examiner*—Hunter L. Auyang
*Attorney, Agent, or Firm*—Ronald D. Hantman

[57] ABSTRACT

The present invention is a method for producing an optically enhanced thin film photovoltaic device.

The method includes the steps of producing an active layer of semiconductor material wherein the surface of at least one side of the active layer is textured such that the surface includes randomly spaced, densely packed microstructures of predetermined dimensions of the order of the wavelength of visible light in the semiconductor material and attaching a reflecting surface directly to one side of the semiconductor material and making an ohmic contact to the material.

15 Claims, 14 Drawing Figures

METHOD FOR MAKING OPTICALLY ENHANCED THIN FILM PHOTOVOLTAIC DEVICE USING LITHOGRAPHY DEFINED RANDOM SURFACES

CROSS REFERENCE TO RELATED APPLICATIONS

This application is a continuation-in-part of U.S. Ser. No. 405,075, filed Aug. 4, 1982 now abandoned.

BACKGROUND OF THE INVENTION

The present invention concerns photovoltaic semiconductor devices. In particular, the present invention is a method for making thin film photovoltaic devices whose absorption of incident radiation is enhanced. Examples of photovoltaic semiconductor devices include solar cells, and photodiodes. The following discussion will be directed towards a solar cell as a specific example of a photovoltaic device.

Absorption of light in a solar cell is governed by the optical properties of the semiconductor materials used to form the active layers of the cell. Optical absorption in the active layers imposes constraints on the minimum thickness of the semiconductor materials used to form the cell. Such thickness requirements impose severe purity constraints on the semiconductor materials. This follows because the purity of the active material determines the lifetime of the electron hole pair that is generated by the absorbed sunlight. The lifetime determines the average length or collection width over which carriers can be collected in the device. To maximize this requires high purity active material. Therefore, it is desirable to enhance the effective absorption within the active material because (1) the thickness of the active material can be reduced and (2) semiconductor purity requirements can be relaxed.

These considerations are particularly important for amorphous and indirect gap semiconductors. In indirect gap semiconductors, like silicon, the solar radiation is weakly absorbed. For silicon more than 50 microns of material is required to effectively absorb solar radiation. If the optical absorption were enhanced, thinner cell thickness would be required and lower purity material could be used. In amorphous silicon, blue light is absorbed in a thickness of less than 1 $\mu$m while near infrared radiation (750–800 nm) requires at least 10 $\mu$m for complete absorption. Since the cell must have a minimum thickness to allow for absorption of incident sunlight, the collection width must be of the order of the cell thickness to allow for the generated electron-hole pairs to contribute to the electric current. Since the collection width for amorphous silicon is at best 1.5 $\mu$m, optical enhancement could provide a significant improvement in the collection efficiency of near infrared radiation. This in turn should allow the overall cell efficiency to be increased.

In the past decade, there have been a number of suggestions for the use of light trapping by total internal reflection to increase the effective absorption in the indirect gap semiconductor, crystalline silicon. The original suggestions (A. E. St. John U.S. Pat. No. 3,487,223 and O. Krumpholz and S. Moslowski, Z. Angew. Phys. 25, 156 (1968) were motivated by the prospect of increasing the response speed of silicon photodiodes while maintaining high quantum efficiency in the near infrared.

Subsequently, it was suggested (D. Redfield App. Phys. Lett. 25, 647 (1974) and D. Redfield U.S. Pat. No. 3,973,994) that light trapping would have important benefits for solar cells as well. High efficiency could be maintained while reducing the thickness of semi-conductor material required. Additionally, the constraints on the quality of the silicon could be relaxed since the diffusion length of minority carriers could be reduced proportionate to the degree of intensity enhancement. With such important advantages, interest in this approach has continued, but no significant advances in the design and fabrication of optically enhanced solar cells have been made. However, significant advances in the theoretical understanding of the light trapping problem have occurred. In particular, light trapping by total internal reflection of coherently and incoherently scattered radiation has been analyzed. Coherent scattering processes have been shown (P. Sheng, A. N. Bloch and R. Stepleman, Appl. Phys. Lett. Vol. 43, 579, 1983) to couple incident light, into guided wave modes within the semiconductor film. Coherent scattering occurs for surface textures which are periodic, such as gratings, and the well defined phase relationship of scattered waves produces constructive and destructive interference. Optimization of light trapping from coherently scattering surface textures can be difficult because scattered waves must couple to guided wave modes within the film. Coupling is accomplished by tuning the periodicity of the surface texture to match guided wave modes in a semiconductor film having a particular thickness and reflector structure. If the periodicity of the surface texture is not properly chosen, then light in the spectral region of interest will not be efficiently trapped within the film. Difficulties in tuning coherently scattering surface textures can be avoided by utilizing non-periodic surface textures which incoherently scatter light. Incoherent scattering processes tend to randomize the direction of light propagation within the semiconductor film and hence eliminate sharp constructive and destructive interferences which occur in coherent scattering processes. A statistical, mechanical analysis of the light trapping problem has shown (E. Yablonovitch and G. Cody, IEEE Trans. Electron Devices ED-29, 300 1982) that a thermodynamic limit exists for enhancement from incoherent scattering processes. Full phase base randomization of incoming light was shown to produce a maximum adsorption increase of $4n^2$ over that from a comparable nonscattering film, where n is the semiconductor index of refraction. This enhancement factor can be quite large, and in the case of amorphous silicon is approxiately equal to 60. Complete statistical randomization of internal light is never absolutely ensured and the $4n^2$ factor must be regarded as an upper limit to the absorption increase produced from incoherently scattering surface textures. Incoherently scattering surface textures are incorporated into solar cells attainable absorption increases will be significantly reduced due to optical absorption in electrical contacts and reflector structures, which is parasitic to the enhancement process. Thus, using incoherent scattering processes to enhance absorption of photovoltaic devices it is necessary to (1) produce a surface texture which efficiently randomizes the direction of light within the semiconductor layer and (2) fabricate cell geometries which minimize parasitic optical absorptions.

SUMMARY OF THE INVENTION

The present invention is a method for producing an optically enhanced thin film photovoltaic device having electrical contacts to carry current from the device.

The method includes the steps of producing an active layer of semiconductor material wherein the surface of at least one side of the active layer is textured such that the surface includes randomly spaced, densely packed microstructures of predetermined dimensions of the order of the wavelength of visible light in the semiconductor material and attaching a reflecting surface directly to one side of the semiconductor material and making an ohmic contact to the material such that the parasitic optical absorption in the electrical contacts and the reflecting surface are less than $5/n^2$, where n is the semiconductor index of refraction.

Light passes into the semiconductor material where photon absorption generates an electron-hole pair within the diffusion length of the junction. However, some of the incident photons pass through the thin-film semiconductor material unabsorbed. By texturing the reflecting surface in the cell, the weakly absorbed photons can be scattered and partially trapped in the semiconductor material increasing the probability of absorption.

In the preferred method for making the cell, the textured surface is produced by lithographic techniques. The active solar cell is amorphous silicon, which is deposited on the textured surface by glow discharge deposition or sputtering.

DESCRIPTION OF THE PREFERRED EMBODIMENT

For purposes of description, the present invention shall be described and illustrated by solar cells. It is well known that a solar cell contains a semiconductor layer (or layers) which absorbs light producing electron-hole pairs, as well as a junction which separates the electron-hole pairs producing useful electrical energy. The semiconductor layers (or layer) which absorb light will be referred to as the active layers or semiconductor material. The semiconductor material and the layers which provide electrical contacts will be referred to as the solar cell material. A thin film solar cell will be considered to be any cell built up from a substrate which is not part of the solar cell material. A thick film solar cell will be considered to be any cell that can be conveniently fabricated starting with an active layer.

Figure 10:
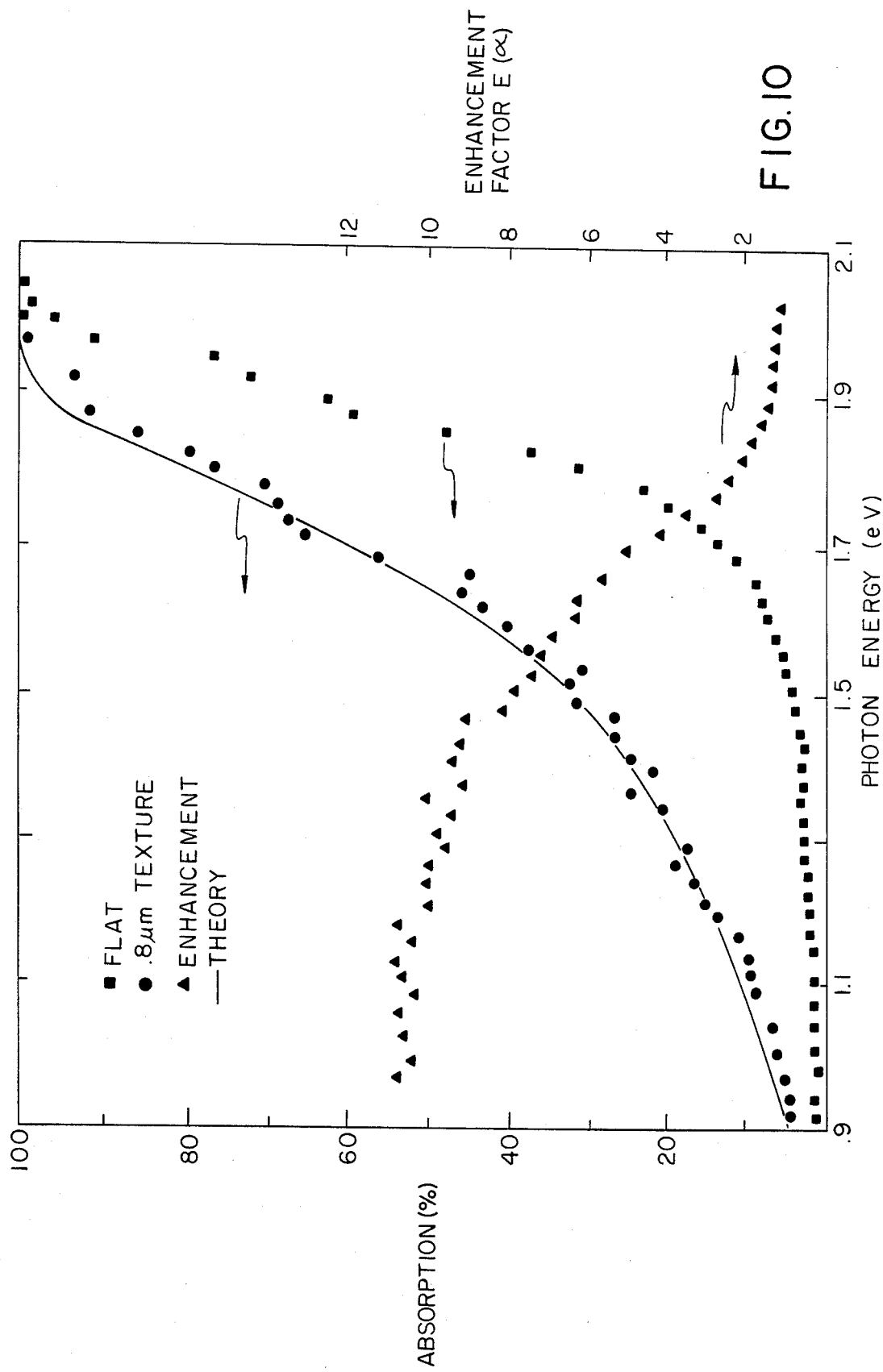
FIG. 10 shows the comparison of normalized absorption probability for flat and textured 0.85 μm thick a-SiH$_x$ films in addition to the enhancement factor E(ε).
Figure 11:
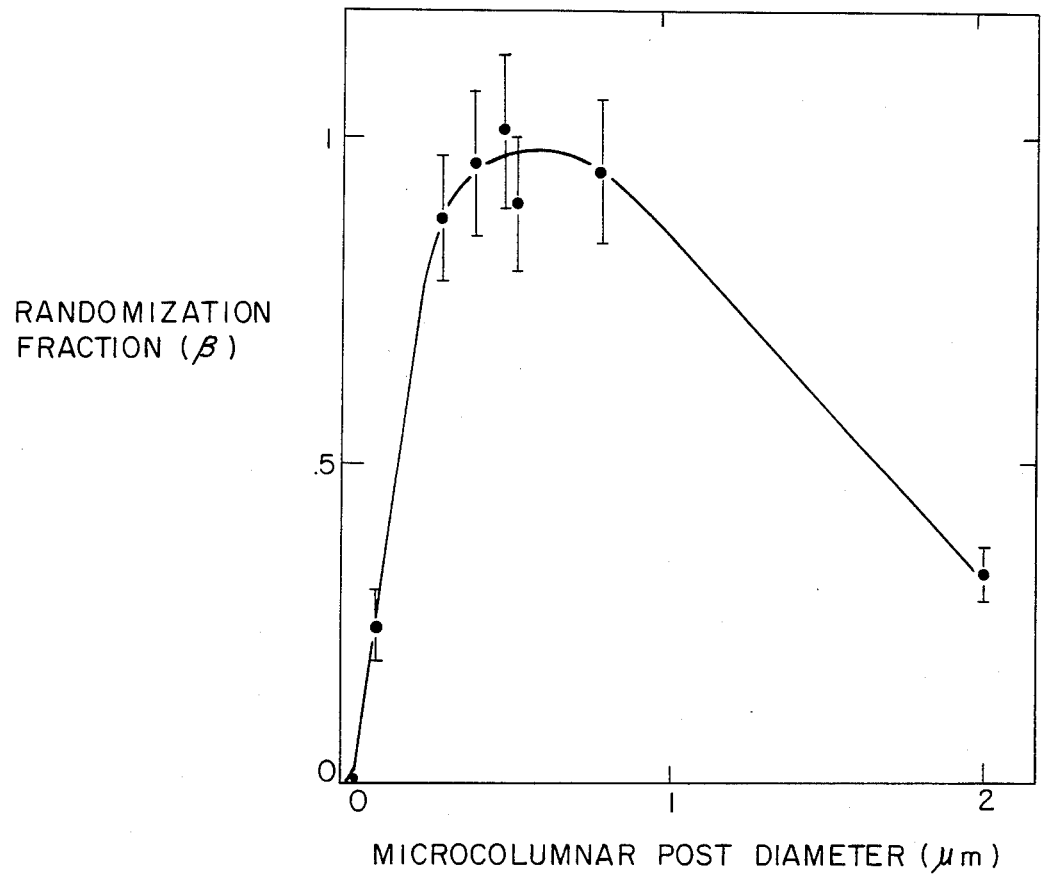
FIG. 11 shows the dependence of randomization fraction β on microcolumnar post diameter, holding post height constant in the narrow range of 1400–2200 A.

The present invention is a method for making an optically enhanced thin film solar cell. The cell includes a transparent conductor, semiconductor material, and a reflecting surface. The semiconductor material is sandwiched between the transparent conductor and the reflecting surface. The reflecting surface may be either simply a metal or a tuned reflector composed of a layer of transparent conductor fixed to a metal. The specific embodiments of the invention are described below. The optically enhanced solar cell utilizes a surface texture which incoherently scatters light. It is preferred that the surface texture produce absorption increases of at least 75 percent of the thermodynamic light of $4n^2$. A more preferred increase is 90% of the thermodynamic limit. To evaluate the extent to which any surface texture approaches the statistical limit, it is necessary to measure absorption of equivalent textured and flat semiconducting sheets in the absence of electrode and reflector absorption or in a system with precisely known parasitic absorption. Absorption in flat and textured semiconductors can be measured directly using either photothermal deflection spectroscopy or photoconductivity and indirectly withan integrating sphere which detects both specular and diffuse transmission and reflection. The ratio of optical absorption in equivalent textured and flat semiconductors is the experimentally determined enhancement factor, E (ε), which depends on photon energy, ε. Surface textures used in the production of optically enhanced solar cells according to the present invention are lithographically defined. FIG. 10 shows absorption probabilities and an enhancement factor measured with photothermal diflection spectroscopy (H. W. Deckman, C. B. Roxlo 9 and E. Yablonovitch, Optics Letters, Vol. 8, 481, 1983) for 0.85 μm thick flat and textured a-SiH$_x$ films. To eliminate parasitic absorption, a-SiH$_x$ films were deposited on quartz substrates rather than electrically conducting substrates. Photothermal diflection spectrocopic measurements were performed with samples immersed in CCl$_4$ so that the a-SiH$_x$ film was surrounded on both sides with a dielectric medium having a refractive index equal to 1.46. With this geometric arrangement, the maximum enhancement factor, $\epsilon$, should be 2 ($^n$a-SiH$_x$/1.46)$^2$=11.5 where $^n$a-SiH$_x$ is the refractive index of the a-SiH$_x$ in the spectral region of interest. The measured enhancement factor, E, is approximately equal to $\epsilon$, indicating that complete randomization of light was produced by the lithographically defined surface texture. The lithographically defined surface texture used for the sample shown in FIG. 10 was comprised of 0.8 μm diameter dense packed, randomly arranged microcolumnar posts, 0.24 μm high. The solid line in FIG. 10 shows the theoretical enhanced absorption expected for complete randomization of light within the semiconductor film. Close agreement of the experimental points with the theory indicates that full statistical behavior has been achieved for light trapped in the semiconductor film. This result is not achieved with all surface textures however. Texture performance can be quantitatively modeled by introducing the concept of incomplete randomization. When the texture does not efficiently scatter light than only a fraction, $\beta$, of incoming light will be scattered into an angular distribution that results in trapping. Monte carlo simulations of the trajectory of scattered rays shows that there is an overriding tendency of scattered light to be randomized. Thus, it is possible to define as a randomization fraction and model the experimentally observed absorption, $F_{exp}$, as the weighted sum of randomized and specular portions.

$$F_{exp}(\epsilon) = \beta F_{enh}(\epsilon) + (1-\beta) F_{flat}(\epsilon) \quad (1)$$

Where $F_{enh}(\epsilon)$ and $F_{flat}(\epsilon)$ are theoretical absorptions for complete random and specular behavior, respectively, and $\epsilon$ is the photon energy. In the long wavelength or low absorption limit, equation 1 can be rewritten as $$\beta = (E-1)/\epsilon - 1) \quad (2)$$

Where E is the experimentally measured enhancement factor and is the theoretical enhancement factor for full statistical light trapping. For measurements of the type shown in FIG. 10 where there is no parasitic absorption $$\xi = 2\left(\frac{n_s}{n_e^2}\right)^2 \quad (3)$$

where $n_s$ and $n_e$ are indicies of refraction for the semiconductor and surrounding dielectric media. Equation 2 has been used to define a randomization fraction for wide range of textures. Randomization fractions observed in thin semiconductor films deposited on glass textured by either sandblasting or hydrofluoric acid etching are 0.4–0.6 and 0.1–0.4, respectively. Smaller enhancement factors have been observed from naturally occurring roughness of electrical contacts overcoated with semiconductor films. Deposited silver and indium-tin oxide films (0.05–0.5 μm thick) can often have residual surface roughness sufficient to produce randomization fractions of 0.15 and 0.3, respectively. For lithographically defined surface textures, however, full statistical behavior can be achieved ($\beta$ nearly equal to 1). FIG. 11 shows the measured dependence of randomization fraction on feature size for a lithographically defined texture. Surface textures were created by lithographically patterning silica substrate with identical closely packed randomly arranged microcolumnar posts which were subsequently overcoated with a 1 micron thick a-SiH$_x$ film. In FIG. 11, post height was held constant in the narrow range of 1,400–2,200 A while the diameter was varied from 500 A to 20,000 A. Attainment of nearly complete randomization is attributed to the scattering efficiency of microcolumnar posts having dimensions on the order of the wavelength of light in the semiconductor. Since this surface texture produces essentially full internal phase space randomization of light, it would be impossible to produce larger absorption increases with any other incoherently scattering surface texture. Absorption increases from any other surface texture would be at most equal to that obtained from an optimal lithographically defined surface texture. The present invention defines a method for making optically enhanced thin film solar cells using lithographically defined random surface textures which produce essentially complete internal phase space randomization of light within the semiconductor.

Figure 1:
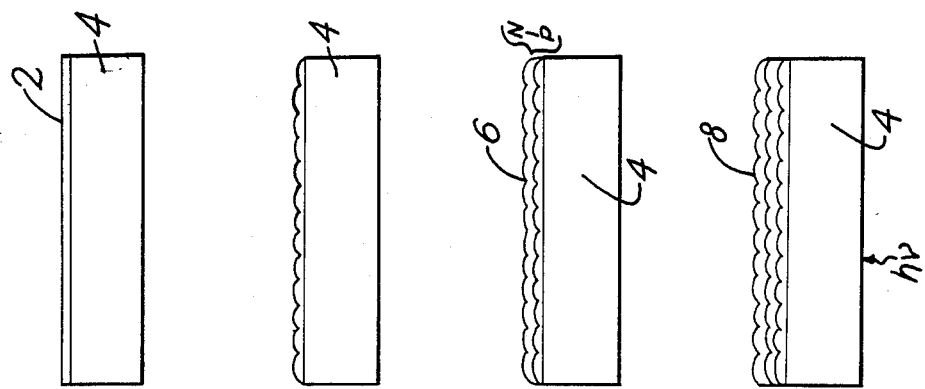
FIG. 1 shows a schematic diagram of the steps of the method for producing an enhanced thin film solar cell according to the present invention.

FIG. 1 shows a schematic diagram of one of the embodiments of the process for producing the optically enhanced thin film solar cell. The first step produces a textured transparent conductor. This is achieved by depositing a transparent conductor 2 onto a transparent substrate 4. The transparent conductor 2 is then textured by lithographic techniques. These techniques produce a surface of microstructures of predetermined dimensions of the order of the wavelength of visible light in the semiconductor material.

After the transparent conductor 2 is textured, semiconductor material 6 is deposited on the textured conductor. The material may be deposited by chemical vapor deposition, physical vapor deposition, sputtering or glow discharge. The solar cell material is deposited so that it conforms to the shape of the textured conductor. In this particular embodiment, the active material is amorphous silicon 6 which is comprised of three distinct layers. A layer P of doped a-SiH$_x$ of p-type is deposited on the transparent conductor 2 and a layer 1 of intrinsic a-SiH$_x$ is deposited on top of the p-layer with a junction being formed between the P and I layers. A layer N of doped a-SiH$_x$ of n-type is deposited on top of the intrinsic layer I to form an ohmic contact. This particular arrangement of semiconductor material 6 is referred to as a PIN solar cell configuration.

A reflecting surface 8 is then attached to the semiconductor material 6 such that it conforms to the shape of the semiconductor material 6 and makes an ohmic contact with the semiconductor material 6. The reflecting surface 8 may be a simple metal (Ag, Cu, Au) or a tuned reflector comprised of a thin transparent conductor overcoated with a metal.

Figure 2:
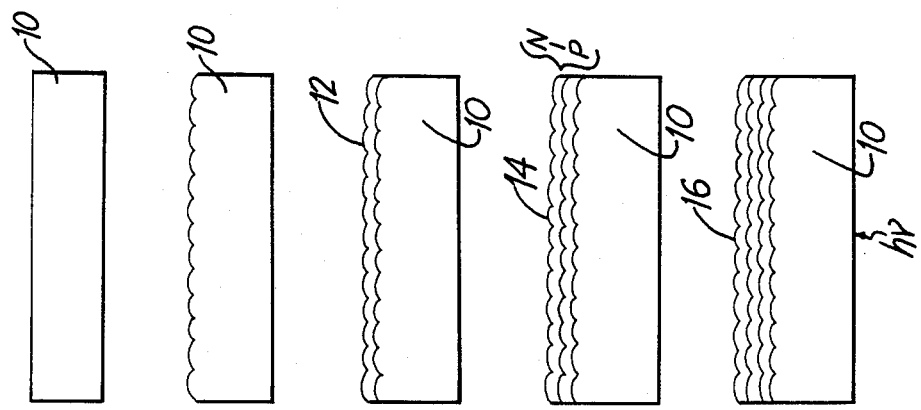
FIG. 2 shows a schematic diagram of an alternative embodiment of the steps of the method for producing an enhanced thin film solar cell according to the present invention.

FIG. 2 shows an alternative embodiment of the present invention. In this case, the transparent substrate 10 is textured and a transparent conductor 12 is deposited on the substrate 10 such that the conductor 12 conforms to the shape of the textured substrate 10. The remaining steps are the same as for the embodiment disclosed in FIG. 1. That is, the active material 14 is deposited onto the transparent conductor 12 followed by a reflecting surface 16 making an ohmic contact with the semiconductor material 14. The active material 14 in this example is comprised of three distinct layers, namely p-type P, intrinsic I, and n-type N. The reflecting surface 16 may be a simple metal (Ag, Cu, Au) or a tuned reflector comprised of a thin transparent conductor overcoated with a metal. Both the semiconductor material 14 and the reflecting surface 16 conform to the shape of the transparent conductor 12.

Figure 3:
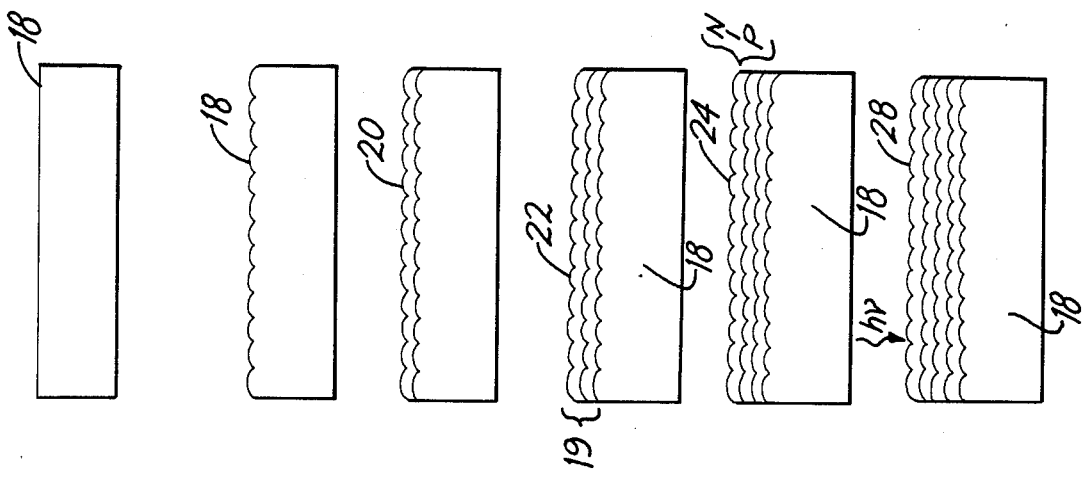
FIG. 3 shows a schematic diagram of another alternative embodiment of the steps of the method for producing an enhanced thin film solar cell according to the present invention.

Referring to FIG. 3, another embodiment of the present invention is shown. In this case the substrate 18 is textured. A reflecting surface 20 is attached to the substrate 18 so as to conform to the shape of the textured surface. A diffusion barrier 22, followed by a layer of semiconductor material 24 and a transparent conductor 26 are added in sequence. As before, the semiconductor material in this example is comprised of three distinct layers namely p-type P, intrinsic I, and n-type N. The diffusion barrier 22 is a transparent conducting material. The combination of layers 20 and 22 is referred to as a tuned reflector 19. The thickness of the diffusion barrier 22 can be adjusted to minimize the optical absorption in the reflecting surface 20. Each layer conforms to the shape of the preceeding layer. The last layer, the transparent conductor 28, forms an ohmic contact with the semiconductor material 24. A more detailed discussion of the embodiments of the present invention follows below.

The substrate 4, 10, and 18 may be any material suitable for supporting the textured solar cell. It should be noted that the substrate serves only as a support in the embodiment shown in FIG. 1. However, the substrate 10 and 18 are themselves textured in the embodiments shown in FIGS. 2 and 3. It should be noted that in embodiments shown in FIGS. 1 and 2 the substrates 4 and 10 should be optically transparent. Particularly useful substrates include glass, quartz, fused silica, and sapphire ($Al_2O_3$). In some applications it may be desirable to use a plastic. In the embodiment shown in FIG. 3, the substrate 18 need not be transparent. Suitable substrates for the embodiment shown in FIG. 3 include steel, aluminum, glass, and quartz.

Figure 12:
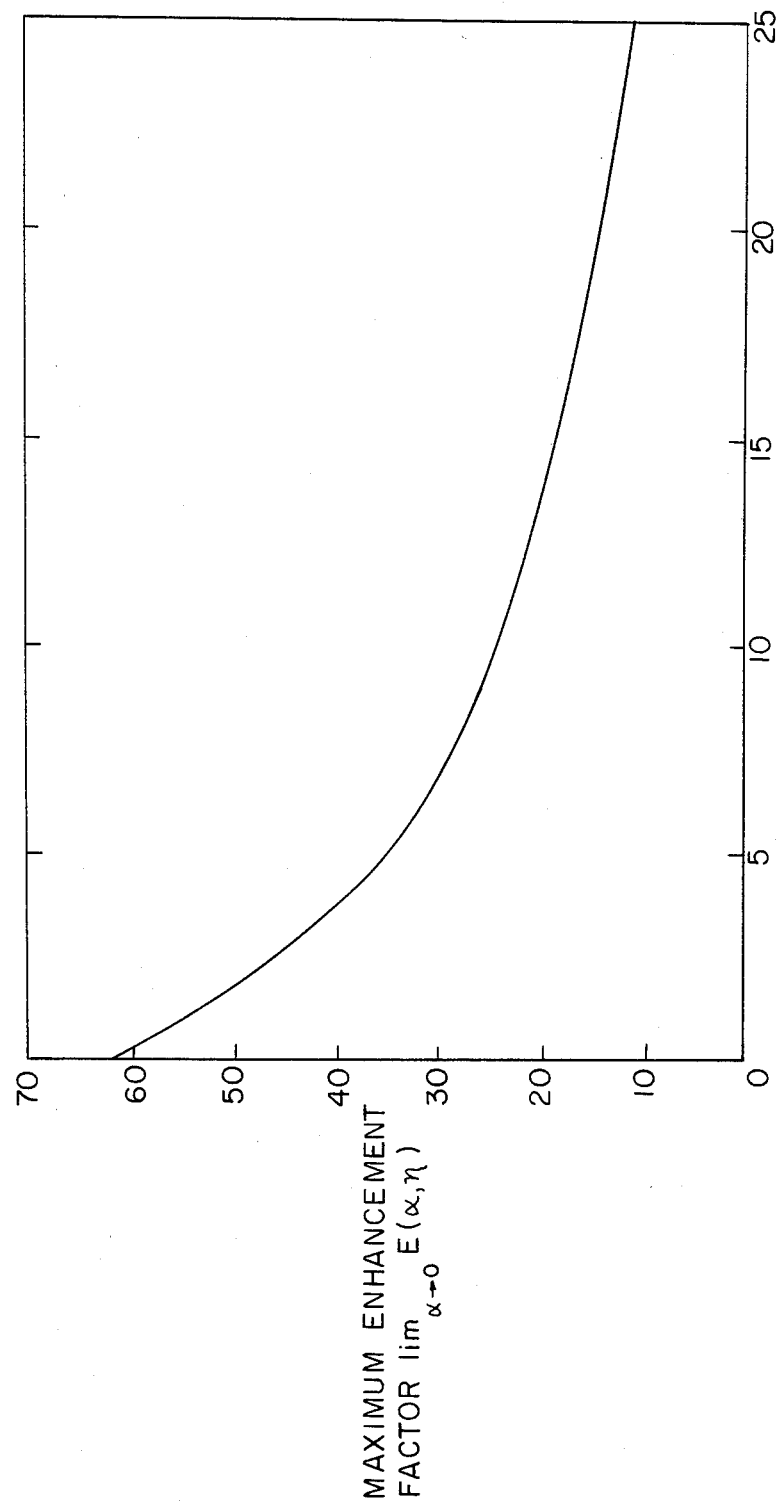
FIG. 12 shows a theoretical estimation of the magnitude of the decrease in the maximum attainable enhancement factor for amorphous silicon as a function of the parasitic absorption in the electrical contact.

In constructing optically enhanced solar cells it is necessary to minimize optical absorption in the transparent electrical contacts and reflector structure. Since weakly absorbed light in the semiconductor will bounce many times against the electrical contacts, small absorptions in these contacts can result in a large reduction in the absorption increase within the semiconductor film. A theoretical estimation of the magnitude of the decrease in the maximum attainable enhancement factor for amorphous silicon as a function of the parasitic absorption in the electrical contact is shown in FIG. 12. It is seen that if the parasitic absorption is only 6 percent, the maximum attainable enhancement factor will be only one half that with no parasitic absorption. The theoretical calculation for the maximum attainable enhancement factor in the presence of parasitic absorption was performed by calculating from an infinite geometric progression representing the multiple reflections of an average light ray scattered back and forth across the film. In all cases there is a significant advantage to reducing the parasitic absorptions in electrical contacts and reflector structures and it is preferred that the absorption in the reflector be less than $5/n^2$ and similarly all absorptions in the transparent electrical contacts should be less than $5/n^2$. A more preferred reduction in absorption is $1/n^2$ for both the reflector and contacts.

All of the transparent conductors 2, 12, and 22 should have several properties including, obviously, optical transparency. Any transparent conductors used in combination with the reflectors 8, 12 and 19 to produce tuned reflectors as described above also share the properties of the transparent conductors described in this paragraph. To significantly enhance the efficiency of a solar cell, the transparent conductor should absorb no more than 3% of light in the spectral region of interest. For instance, if an optically enhanced amorphous silicon solar cell is being fabricated, the single pass optical absorption for the transparent conductor should be no more than 3% in the spectral region from 650–800 nm. The conductor should also have conductivity $<250\Omega/\square$. It should not diffuse into the photovoltaic material 6, 14 and 24 when that material is deposited. The conductor should be thick enough to texture for those embodiments where the conductor is textured.

In the embodiments shown in FIGS. 1 and 2, the transparent conductor 2, 12 and 26 should act as an anti-reflection layer. For the transparent conductor to serve as an anti-reflection layer, its optical thickness after texturing should be approximately $\frac{1}{2}$ or $\frac{3}{4}$ $\lambda$ where $\lambda$ is the wavelength of light in the active layers of the cell. If the active material 6 and 14 in the cell is amorphous silicon, then the average thickness of the transparent conductor should be either 500 A or 1,500 A to provide an anti-reflection layer. In the embodiment shown in FIG. 3, the thickness of the optically transparent diffusion barrier 22 should be tuned so as to minimize the absorption in the metallic reflector. The optimal thickness of this layer depends on the optical properties of the metallic reflector 20; however, for many applications the optical thickness of the diffusion barrier 22 should be $\frac{1}{2}$. If the active material is a 0.75 $\mu$m thick layer of amorphous silicon, then the thickness of diffusion barrier 22 should be a 1000 A thick layer to minimize absorption in the metallic reflector. Materials that are suitable as transparent conductors include reactively sputtered indium-tin-oxide (ITO), ITO prepared by chemical vapor deposition, $SnO_2$, $In_2O_3$ and $CdSnO_4$. The preferred material is sputter deposited indium-tin-oxide.

The reflecting surface 8, 16 and 20 may be any material (metal) having low optical absorption and which may be deposited on the cell so as to conform to the textured surface on which it is deposited. It is preferred that the single pass optical absorption in the metal be less than $1/n^2$ of the photons incident where n is the index of refraction for the semiconductor. If the single pass optical absorption in the metallic reflector is greater than $1/n^2$, then optical enhancement will be greatly diminished. Optical absorption can be minimized by either using a metal which is a good reflector, or by building a tuned reflector. Absorption in the reflector 20 can be minimized by incorporating a thin film of transparent conductor 22 between the active material 24 and metal so as to tune the entire reflector 19. A tuned reflector 19 is shown only in the embodiment of FIG. 3. However, a tuned reflector may be included in the embodiments of FIGS. 1 and 2 as described herein. The reflectivity of the composite tuned reflector 19 depends upon the thickness of the transparent conductor 22 as well as the optical properties of the metal 20. Minimizing optical absorption in the reflector maximizes the enhancement of optical absorption in the active layers of the device.

The reflectivity of a metal in direct contact with a semiconductor having a high index of refraction is significantly less than if it were in contact with air. Thus, many metals which are normally considered to be good reflectors in air, will not produce a large optical enhancement. Table I lists the optical absorption of normally incident light by a flat metal film deposited on a thick layer of a-SiH$_x$.

TABLE I

OPTICAL ABSORPTION IN METALS DEPOSITED ON THICK FILMS OF a-SiH$_x$

| Metal | % Optical Absorption of Metal Deposited on a-SiH$_x$ |
|---|---|
| Ag | 8 ± 2 |
| Au | 8 ± 2 |
| Cu | 8 ± 2 |
| Al | 33 ± 3 |
| Mg | 80 ± 4 |
| Ni | 61 ± 3 |
| Cr | 66 ± 4 |
| Pt | 76 ± 7 |

In Table I, optical absorption is computed from the optical constants of metals. The refractive index of amorphous silicon is taken to be 4. Light is assumed to be normally incident and wavelength is taken to be 7,500 Å.

Figure 13:
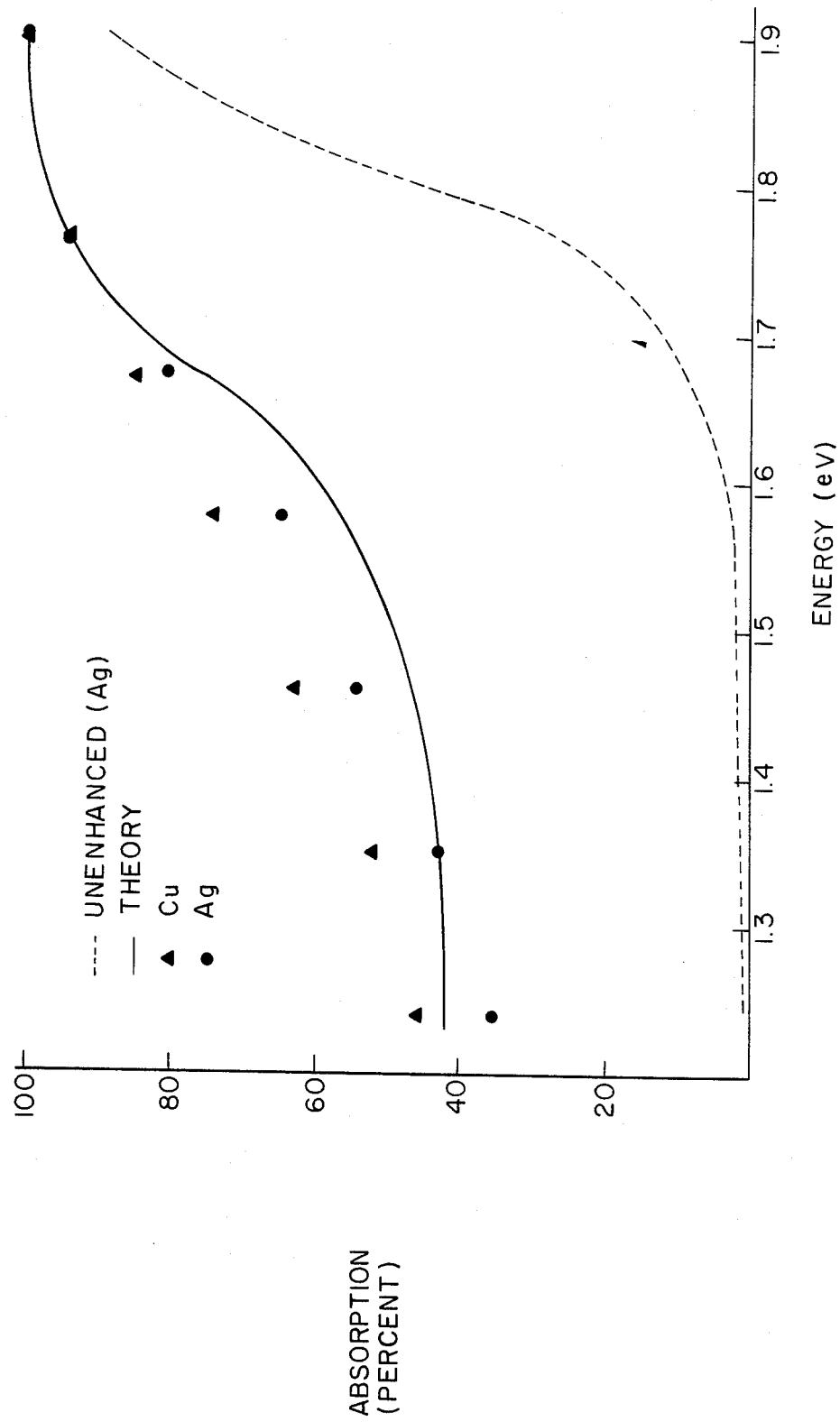
FIG. 13 shows a measurement made with photothermal deflection spectroscopy of optical absorption probabilities in Cu and Ag reflectors deposited on 0.8 μm thick textured a-SiH$_x$ films.

Parasitic absorption can be experimentally measured by depositing electrodes and reflectors over textured semiconductor surfaces which are known to produce complete randomization of light. FIG. 13 shows a measurement made with photothermal deflection spectroscopy of optical absorption probabilities in Cu and Ag reflectors deposited on 0.8 μm thick textured a-SiH$_x$ films which produce full internal phase space randomization of light ($\beta = 1$). Also shown in FIG. 13 is the measured absorption probability for an Ag reflector deposited on a flat a-SiH$_x$ film. The solid line in FIG. 13 shows the optical absorption probability expected in the textured reflectors for a parasitic optical absorption of 8%. When total absorption is measured in flat and textured films with identical electrode structures the experimentally determined enhancement factor, E, is given by $$E = \frac{1}{\left(\frac{n_e}{n_s}\right)^2 + \eta} \quad (4)$$

Where n$_s$ and n$_e$ are the indexes of refraction for the semiconductor and surrounding dielectric media and n is the parasitic absorption. Table 2 shows measurements of a parasitic absorption in reflector structures deposited on lithographically textured one micron thick amorphous silicon films.

Inspection of Tables I and II reveal that the preferred reflectors for embodiments shown in FIGS. 1 and 2 are Cu, Ag and Au. Materials like Al, Ni, Cr and Pt have too much absorption to produce a significant optical enhancement. It should be noted that the optical properties of Cu, Ag and Au are such that solid state plasma oscillations may be strongly excited. Moreover, it has been previously shown [See S. Garoff, D. A. Weitz, T. J. Gramila, and C. D. Hanson, Optics Letters 6, 245 (1981)] that plasmons can produce an increase of optical absorption on roughened surfaces. This increase is seen in Table 2 where the absorption in copper and silver metallic reflectors are found to be 100 to 200 percent larger when textured.

TABLE 2

| Parasitic Absorption in Flat and Textured Reflectors*** | | | |
|---|---|---|---|
| | Texture with $\beta = 1$ | | Flat |
| Reflector Composition | Measured Absorption Probability F$_{exp}$ (%) | Parasitic Absorption n (%) | Parasitic Absorption n (%) |
| Ag | 35 | 8.5 | 3.9 |
| Cu | 45 | 12.5 | 4.2 |
| Al | 82 | 27 | 22 |
| ITO* | 46 | 13 | 15 |
| IO* | 24 | 4 | 5 |
| Cu + ITO** | 61 | 24 | 28 |
| Ag + ITO** | 62 | 25 | 29 |

*Both indium tin oxide (ITO) and indium oxide (IO) were 1,000Å thick films and were measured with a white backing. ITO films were deposited by sputtering and IO films were evaporated.
**Both Cu and Ag were deposited as a backing for ITO.
***Measurements were made at 900 nm where a-SiH$_x$ films are nonabsorbing. Measured absorption is due to reflector structures.

As such the rough metal surfaces 8, 16 and 20 shown in FIGS. 1, 2 and 3, respectively, can have optical absorptions significantly greater than that indicated in Table I. Increases in optical absorption by plasmons in the metal will reduce the amount of enhancement obtained. It is thus preferable to minimize the increase of optical absorption due to texturing in Ag, Cu, and Au reflectors. This effect can be minimized by creating surfaces which are rough on scale lengths longer than about 500 Å and are smooth at scale lengths shorter than about 500 Å. An example of such a surface is a sinusoidal modulation with a periodicity of 6,000 Å. Such surfaces are preferred because roughness on scale lengths less than about 5000 Å tends to produce the largest increases in optical absorption. These considerations are most important for metals like Cu, Ag or Au and less important for metals like Al and Ni.

It should be noted that the metallic reflectors must be deposited on the active layer in a manner such that the metal does not diffuse into the semiconductor. Metallic impurities in the semiconductor will decrease the electron hole lifetimes, leading to a degradation in performance of the device. Metals like Cu, Ag, Au, and Al can be deposited by thermal evaporation onto a-SiH$_x$ without any significant diffusion problems.

Rather than use a simple metal as a reflector, it is possible to use a tunable reflector comprised of a metal with a layer of transparent conductor separating it from the active layers. Optical absorption in tunable reflectors should be significantly less than that of a corresponding metallic reflector. Optical absorption in tunable reflectors is minimized thus maximizing optical enhancement. Optical absorption of a metal in contact with a transparent conductor will be significantly less than if it were in contact with a semiconductor. This occurs because the index of refraction (typically about 3) of a semiconductor is much greater than that of a transparent conductor (typically about 2) and the index of refraction determines optical absorption for a metal contacting the aforementioned materials. This can be analytically demonstrated for light normally incident on the interface between the metal and a dielectric medium. For normally incident light the optical absorption in the metal is $$\text{Fractional Absorption} = 1 - \frac{(n_{metal} - n_{dielectric})^2 + k^2_{metal}}{(n_{metal} + n_{dielectric})^2 + k^2_{metal}}$$

where $n_{metal}$ is the refractive index of the metal, $n_{dielectric}$ is the refractive index of the dielectric and k is the absorption index of the metal. For fixed values of $n_{metal}$ and $k_{metal}$, the fractional absorption monotonically increases with the refractive index of the dielectric.

Thus, a tuned reflector 19 should be superior to a metallic reflector in direct contact with the semiconductor. The performance of a tuned reflector may be optimized by utilizing optical properties of transparent films to further minimize absorption in the metal. For light of a particular wavelength, the transparent conductor thickness can be adjusted to minimize the electric field produced by the light at the metal surface. An exact computation of the optimal transparent conductor thickness requires knowledge of the optical properties of the metallic reflector. For good reflectors the thickness of the transparent conductor should be $\frac{1}{4}\lambda$ where $\lambda$ is the wavelength of light at which the photovoltaic device operation is being enhanced. If the tuned reflector is deposited prior to depositing the active material (FIG. 3), the transparent conductor must act as a diffusion barrier. If the tuned reflector is deposited after the active layers have been formed, the barrier properties of the transparent conductor are not as important.

The semiconductor material 6, 4, 24 can be any material that can be deposited so as to conform to the textured surface on which it is deposited. It is preferred that the thickness of the semiconductor material be equal to the width over which photogenerated carriers are collected. By making the semiconductor material thickness less than or equal to the width over which photogenerated carriers can be collected the effects of optical enhancement are maximized. When this condition is met the quantum collection efficiency for photogenerated carriers is directly proportional to the total optical absorption in the semiconductor layer. In semiconductors which produce solar cells with efficiencies greater than 8 percent, the collection width for photogenerated carriers is typically greater than $\frac{1}{4}$ micron and several different semiconductors are available for demonstrating optical enhancement effects. Hydrogenated amorphous silicon is particularly useful in that it may be deposited by sputtering or glow discharge. Details of methods for preparing a-SiH$_x$ by glow discharge techniques have been disclosed in the art. De ails of methods for preparing a-SiH$_x$ with sputtering techniques are also known in the art, see e.g., Sputtered Hydrogenated Amorphous Silicon, T. D. Moustakas, Journal of Electronic Materials, Vol. 8, No. 3, (1979).

To prepare optically enhanced a-SiH$_x$ solar cells, the deposition methods described below were utilized.

For glow discharge deposition of a-SiH$_x$, it is preferable to heat the substrate in vacuum to 170°-300° C. An optimal substrate temperature is about 215° C. The silane gas should be flowed through the reactor at 30-100 sccm and the pressure in the reactor chamber should be 75-200 mTorr. A glow discharge is initiated in the reactor using at least 7 watts of 13.56 Mhz radio frequency radiation. An optimal radio frequency power is less than 10 watts. The samples are affixed to the electrodes (cathode and anode) and the anode samples are found to be superior to those produced on the cathode. Electrodes are typically about 6 in. disks separated by 1.5 in. The cathode acquires a bias of about −25 volts with respect to the grounded anode. Doping of the a-SiH$_x$ semiconductor can be accomplished by incorporating 0.7% B$_2$H$_6$ or PH$_3$ into the gas entering the reactor, resulting in p-type or n-type semiconductors, respectively.

Fabrication of the active layers 6, 14 and 24 of a photovoltaic device requires that a junction be formed in the semiconductor material. To produce a PIN a-SiH$_x$ solar cell, a layer of p doped a-SiH$_x$ can be deposited to a thickness of 300-1600 A. Without shutting off the plasma, the dopant is removed from the gas entering the reactor and 4,000-10,000 A of a-SiH$_x$ is deposited. To provide an ohmic contact to the device, a layer of n-doped a-SiH$_x$ is deposited to a thickness greater than 50 A. An optimal thickness of the n layer is 250 A. A PIN solar cell deposited in this manner is approximately conformal with the shape texturing on the substrate.

Optical absorption in the active layers is enhanced by texturing. Light scattered from a randomly textured surface (or surfaces) can be trapped in the active layer of the cell by internal reflection. The amount of light trapped depends upon the details of the texturing. It has been shown (E. Yablonovitch and G. Cody, IEEE Transactions on Electron Devices ED 300, 1982) that the intensity of light trapped in the active layers never exceeds $4n^2$ (n is the refractive index of the active layers) times the intensity of externally incident light. For semiconductor materials like silicon and a-SiH$_x$, the maximum increase in light intensity within the cell is about 40-75. Optical absorption is proportional to light intensity in the cell so the maximum increase of absorption is about 40-75. Such an increase can only be obtained if there is no optical absorption in the reflector, and if the scattering surface produces a randomization in direction of light in the active layer.

To scatter light in the active layer 6, 14 and 24, a textured surface is produced with randomly spaced, densely packed microstructures of predetermined dimensions. Size of the microstructures is typically of the order of the wavelength of light in the photovoltaic material. FIGS. 1, 2, and 3 show schematically how a textured surface can be incorporated into a thin film solar cell.

The texturing of the substrate or the transparent conductor is done by etching a pattern in the substrate or conductor after producing a lithographic mask on the surface to be etched. The mask is, preferably, formed by coating a substrate with a monolayer of colloidal particles substantially over the entire surface (about 90%) such that the particles are fixed to the substrate.

The technology of coating a substrate with a monolayer thick random array of colloidal particles is well known. Such coating will be called random colloidal coating and methods for producing them are described by Iler in U.S. Pat. No. 3,485,658, as well as in Iler, Journal of Colloid and Interface Science 21, 569-594 (1966); Iler, Journal of the Americal Ceramic Society 47 (4), 194-198 (1964); Marshall and Kitchener, Journal of Colloid and Interface Science 22, 342-351 (1966); and Peiffer and Deckman, U.S. patent application Ser. No. 55,266 (allowed). These coating techniques deposit a random array of colloidal particles on the substrate because the colloidal particles are electrostatically attracted to the substrates and adhere at the point where they strike the surface. Electrostatic attraction occurs because a surface charge opposite to that of the substrate is induced on the colloidal particles.

The aforementioned surface charge is created by the surface chemistry of the colloid and substrate. For instance colloidal particles suspended in water acquire a surface charge which may be adjusted by altering the pH of the water. In fact, for many colloidal materials, the pH may be adjusted so that the colloid has zero net charge and this condition is referred to as the isoelectric point. Equivalently, the surface chemistry of most substrate materials produces a surface charge which can be altered by controlling the pH of water in which the substrate is immersed. If the charge on the colloid is opposite to that of the substrate, then a monolayer of colloidal particles can be attracted to the substrate. The time required to attract a monolayer of colloidal particles to the substrate depends on the relative charge of the colloid and substrate as well as the concentration of particles in the colloid. Typically, a monolayer adheres within 1–200 sec when the substrate and colloid are oppositely charged. After the monolayer has been adhered the coated substrate is washed to remove any excess coating material and the substrate is blown dry with air or nitrogen to fix the coating onto the substrate.

If the substrate acquires a charge similar to that of the colloid, then one of two techniques can be used to deposit the colloidal particles. Providing the isoelectric points of the colloid and substrate are different, the pH of the colloidal suspension may be adjusted to produce oppositely charged surfaces. Or if it is not desirable to adjust the pH of the colloid, another colloid having a charge opposite to the substrate and the desired colloid may be deposited to change the sign of the surface charge on the substrate. Preferably, the size of colloidal particles used to reverse the surface charge on the substrate should be small in comparison with the desired colloid. Specifically, the colloid used to reverse the surface charge on the substrate should be sufficiently small so as not to interfere with the lithographic properties of the mask.

The composition of the colloidal particles in the coating may be organic or inorganic and be any material which can be rendered into a colloidal state wherein the particles have charged surfaces. In addition, the particles must have a resistance to the etchant or the deposition material so as to yield the desired pattern. This is discussed further below.

For most applications, the most convenient colloidal particles are polymeric spheres, e.g., polystyrene, polydivinyl Benzene, and polyvinyl toluene. Such spheres are usually made by either suspension or emulsion polymerization. Such spheres can be conveniently fabricated in sizes ranging from 500 A to 20 microns.

Figure 5:
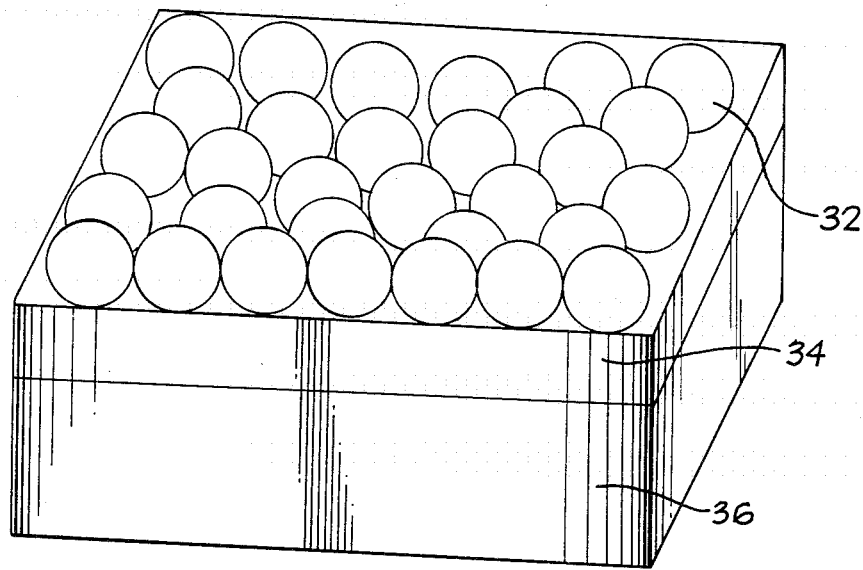
FIG. 5 shows a schematic diagram of a lithographic mask formed according to the method of the present invention.

Referring to FIG. 5 shows a schematic diagram of a lithographic mask produced according to the present invention wherein the colloidal particles are spherical. The mask is an array of colloidal particles 32 adhered to substrate 34. The substrate 34 is the material to be etched and, if necessary, is supported by support 36.

Figure 6:
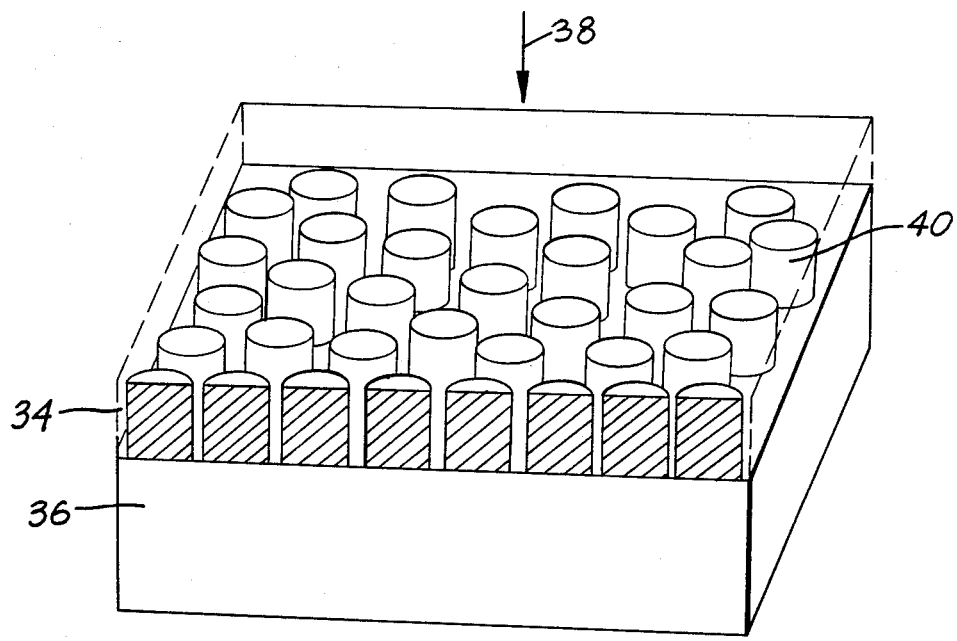
FIG. 6 shows a schematic diagram of an etched surface prepared according to the present invention.

Since the mask 32 is used as an etch mask, a beam of ions 38 is directed at the surface to which are adhered the spheres 32. FIG. 6 shows a schematic diagram of microcolumnar posts which have been etched into the surface 34. The incident ion beam etches away the spheres 32 and the surface 34. The relative etching rates of the spheres 32 and surface 34 determine the configuration of the etched surface 34.

The etched pattern is a random array of posts 40. Each post 40 is cylindrical because the directional ion beam etching both the substrate and mask was terminated by the equator of the spherical mask before impinging on the substrate. Continued etching of the mask and substrate such that the diameter of the mask is significantly reduced during the etching process may result in either oblate or prolate spheriod posts depending on the relative etch rates of the mask and substrate.

If the substrate etches faster than the mask then prolate posts will be obtained. A mask which etches faster than the substrate results in oblate posts. Alternatively, a hemispherical morphology could be created by either an isotropic plasma etching process or by causing the polymer to melt during a directional etching process.

An advantage of the present technique for producing lithographic masks is that etched surfaces with random arrays of submicron structures may be rapidly produced over large areas. Characteristic size of the microstructures can be varied by more than two orders of magnitude because monodisperse spheres are available in sizes ranging from 200 A to 40 $\mu$m. The mean distance between particles is determined by the technique used to deposit the colloidal particles.

The advantages gained over other lithographic techniques in the case of thin film solar cells are the ability to generate masks for structures of controlled periodicity and aspect ratio on a wide range of materials over large areas in a very short period of time. Masks can be prepared over areas of many square inches in less than one minute. Surfaces made from masks prepared by this technique have allowed significant improvements in the optical absorption properties of thin film solar cells.

To study optical enhancement effects, the quantum efficiency of collection of photogenerated carriers has been measured as a function of wavelength. Techniques for measurement of the collection efficiency of carriers have been discussed by C. R. Wronski and D. E. Carlson, Solid State Comm. 25, 421 (1977), C. R. Wronski, B. Abeles and G. D. Cody, Solar Cells 2, 245 (1980) and C. R. Wronski, B. Abeles, G. Cody and T. Tiedge, Appl. Phys. Lett. 37, 96 (1980).

Optical enhancement techniques improve the collection efficiency of a solar cell in the spectral region where light is weakly absorbed. For a 0.8 $\mu$m thick a-SiH$_x$ solar cell, improvements in the collection efficiency are expected in the spectral region from 600–800 nm. For a 250 $\mu$m thick crystalline silicon cell improvement in the collection efficiency should occur in the spectral region from about 1.0–1.2 $\mu$m. Depending upon the spectral region being enhanced, a different microstructure may be used. For a-SiH$_x$ suitable microstructures include 5,000 A diameter posts 1,000–5,000 A high. Another suitable array includes posts with two different diameters of 2,000 and 5,000 A which are etched to a depth of 1,000–4,000 A. It is preferred that the posts be densely packed in a random array. That is, the posts should be as densely packed as possible. If the characteristic lateral dimension of the microstructures is too large, they will not effectively scatter light. For a-SiH$_x$, microstructures larger than 5 $\mu$m in diameter and less than 0.1 $\mu$m high are inefficient light scatterers. If the characteristic dimension of the scatterers is significantly less than the wavelength of light in the active layer, light will not be effectively scattered. For a-SiH$_x$, microstructures about 500 A in diameter etched 500 A deep are inefficient light scatters.

For thin film solar cells like a-SiH$_x$, it should be noted that the lithographic texturing does not lead to an increase in the occurrence of shunting. In fact, it is found the lithographically defined texture substantially increases the yield of good cells.

Specifically the short circuit current of an a-SiH$_x$ solar cell has been increased by more than 2 mA/cm$^2$. This represents a potential improvement of about 20% in the operating efficiency of an a-SiH$_x$ solar cell.

EXAMPLE 1

Figure 4:
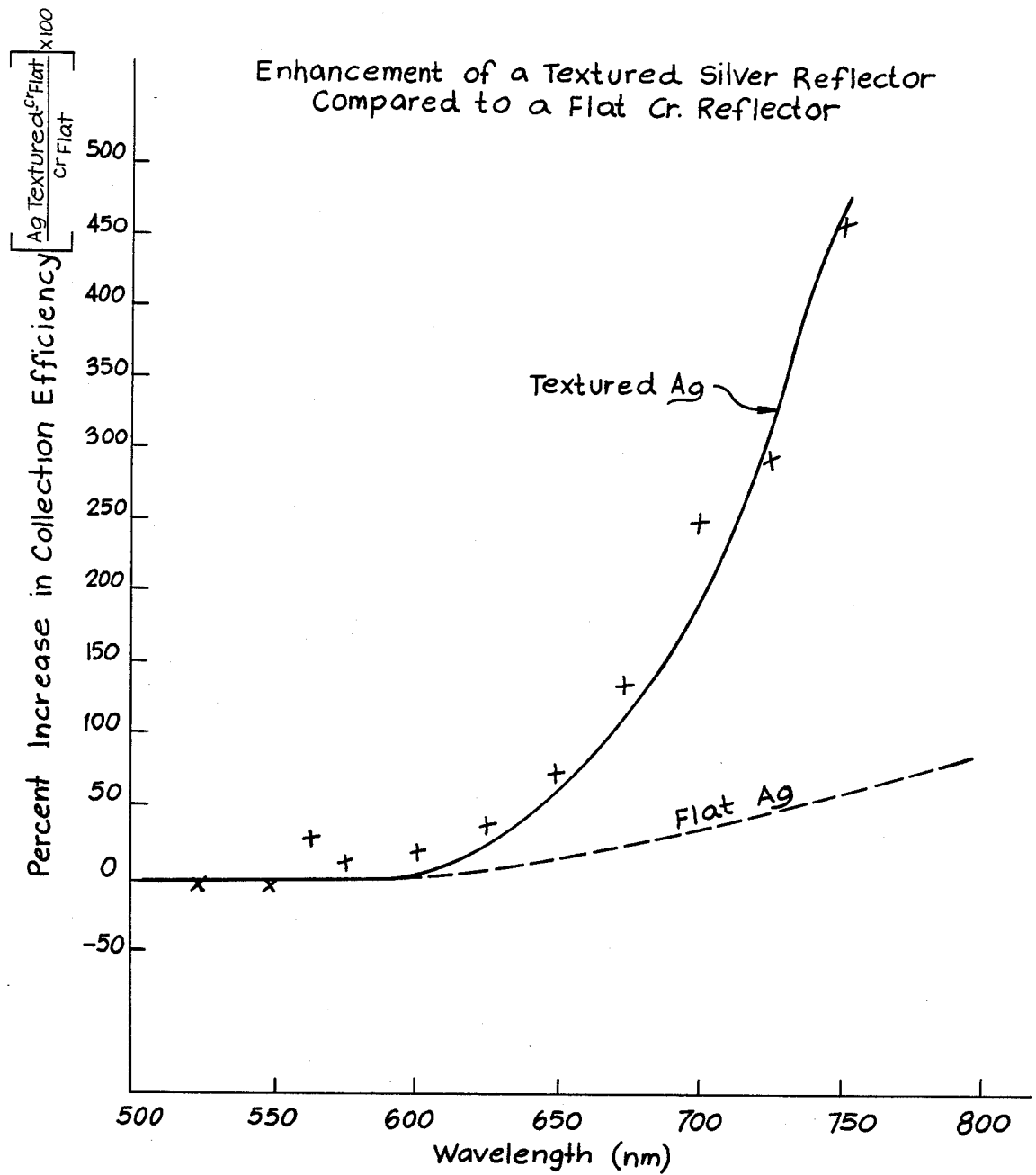
FIG. 4 shows a graph comparing the collection efficiency as a function of wavelength for enhanced and unenhanced solar cells constructed using the embodiment shown in FIG. 1. Improvements in collection efficiency above the dashed line are due to optical enhancement.
Figure 7:
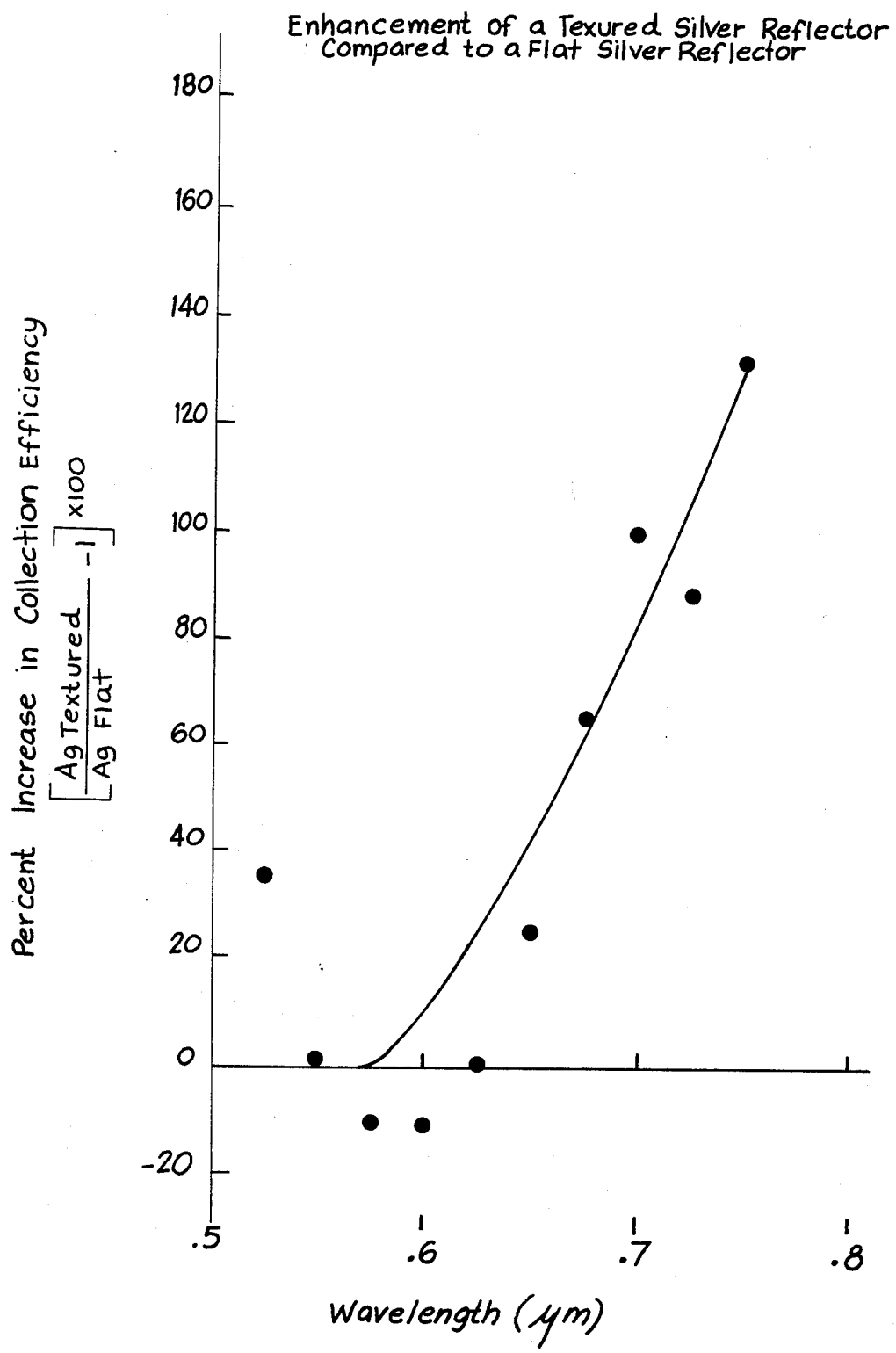
FIG. 7 shows the improvement of collection efficiency for a textured cell compared to a flat cell constructed according to the embodiment shown in FIG. 1. Both cells were constructed with silver reflectors. Increases significantly above 0% are directly attributable to optical enhancement effects.

The method shown in FIG. 1 was used to prepare optically enhanced a-SiH$_x$ solar cells. A commercially available transparent conductor was textured using the lithographic techniques described below:

a. A 1550A thick transparent conductor on a piece of EC glass (Corning glass) was half coated with a random array of 5,000 A diameter polymer spheres.

b. A 500 ev Ar ion beam was used to etch away 700 A of the masked transparent conductor and the polymer spheres were chemically removed.

c. A 8,000 A thick PIN a-SiH$_x$ solar cell was deposited on the textured transparent conductor.

d. Metallic dots of an area about 2 mm$^2$ were evaporated through a lithographic mask to form the reflector. The material contained within each dot comprises a complete solar cell. FIG. 4 compares the collection efficiency of a textured cell with a silver reflector and a flat cell with a chromium reflector. The dashed line shows the measured behavior if the silver cell were flat. Improvement in the collection efficiency above the dashed line is due to optical enhancement. The improvement in short circuit current due to the textured silver reflector (compared with the flat chromium reflector) is about 2 mA/cm$^2$. All measurements of collection efficiency were done with no bias illumination. FIG. 7 compares the collection efficiency of flat and textured silver reflectors for a different a-SiH$_x$ deposition. The increase in collection efficiency differences above 0% is directly due to optical enhancement. If the transparent conductor had been thick enough to permit deeper textures, larger effects could have been obtained. Also, improvements can be obtained if the conductor were textured with both 5,000 A and 2,000 A spheres.

EXAMPLE 2

The method shown in FIG. 2 was used to prepare optically enhanced a-SiH$_x$ solar cells. Only half of the substrate was textured so that a side-by-side comparison could be made of flat and textured cells. Details of the method used to prepare the cells are described below:

a. Half of a $\frac{1}{2} \times 1''$ piece of Corning 7059 glass was coated with an array of 5,000 A spheres.

b. Approximately 5,000 A of glass was removed with a 500 ev reactive ion beam produced from a CF$_4$ discharge. The remaining polymer mask was chemically removed.

c. A 500 A layer of indium-tin oxide was sputter deposited on the substrate.

d. Steps 3 and 4 of Example 1 were repeated.

Figure 8:
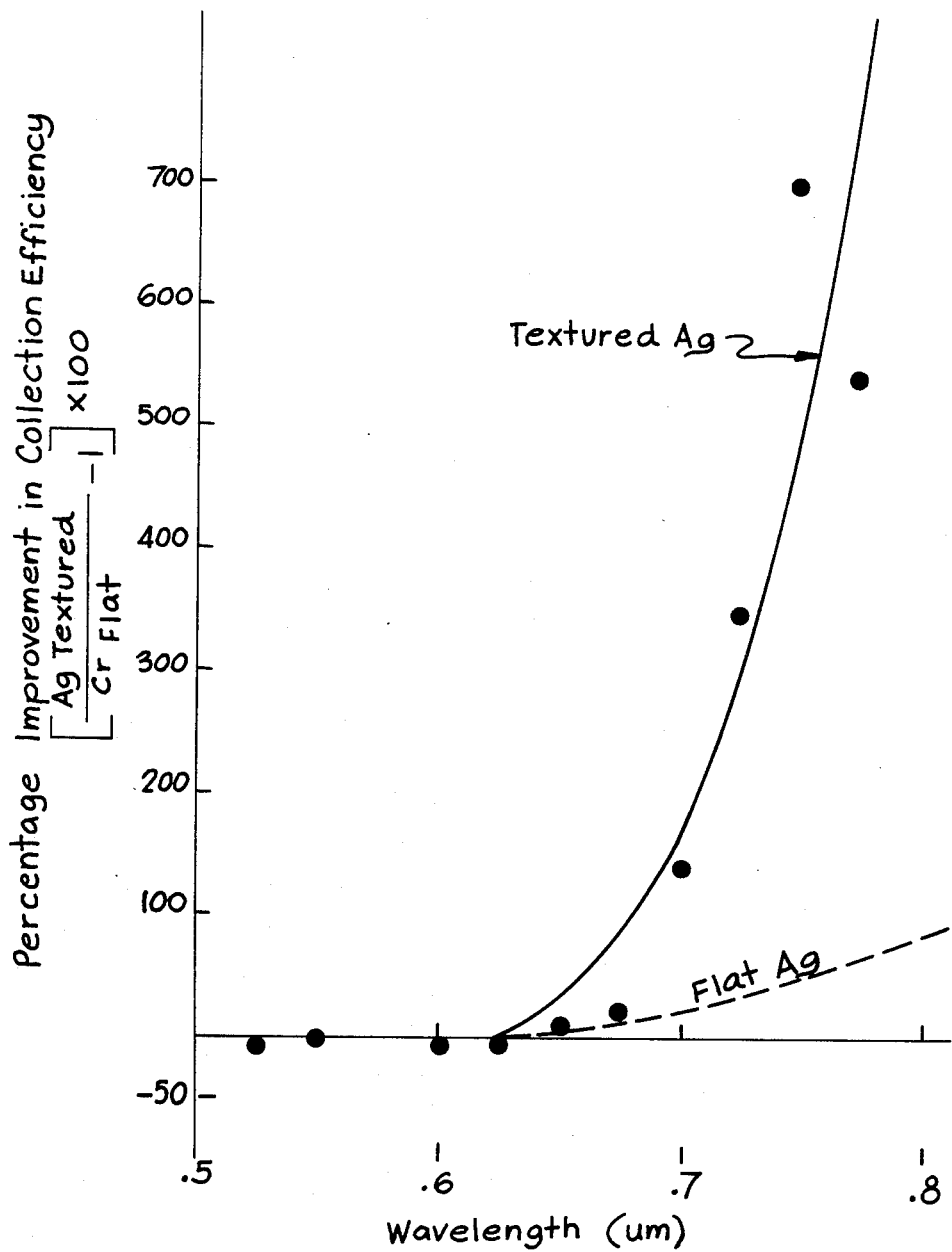
FIG. 8 shows a graph of the enhancement as a function of wavelength for a solar cell constructed according to the embodiment shown in FIG. 2. Increases above the dashed line shown in the figure are due to optical enhancement effects.

FIG. 8 shows the improvement in collection efficiency of a textured silver reflector compared with flat chromium. The dashed line shows the behavior expected if the silver cell were flat. Improvement in the difference of collection efficiencies above the dashed line is due to optical enhancement. The net increase of short circuit current of the textured silver cell over the flat chromium cell is in excess of 2 mA/cm$^2$ (AM1 conditions).

EXAMPLE 3

The method shown in FIG. 3 was used to prepare optically enhanced a-SiH$_x$ solar cells. Only half of the substrate was textured so that a side-by-side comparison could be made of flat and textured cells. Details of the method used to prepare the cells are described below:

a. Half of a $\frac{1}{2} \times 1''$ piece of Corning 7059 glass was coated with a densely packed random array of 4,000 A polymer spheres.

b. A 500 ev reaction ion beam produced from a CF$_4$ gas discharge was used to etch the substrate. Etching of the substrate was terminated after about 5,000 A of glass had been removed. The remaining polymer was chemically removed.

c. A tuned reflector was deposited on the substrate. The metallic layer in the reflector was a 3,500 A thick silver layer evaporated onto the substrate. Absorption in the metallic layer was minimized by sputter coating an about 1,000 A thick indium-tin-oxide film over the silver.

d. The sample was affixed to the cathode of a plasma reactor, and a 10,000 A thick PIN a-SiH$_x$ cell was deposited.

e. To form solar cells 2 mm$^2$ dots of indium-tin-oxide were sputter coated on the front surface of the substrate.

Figure 9:
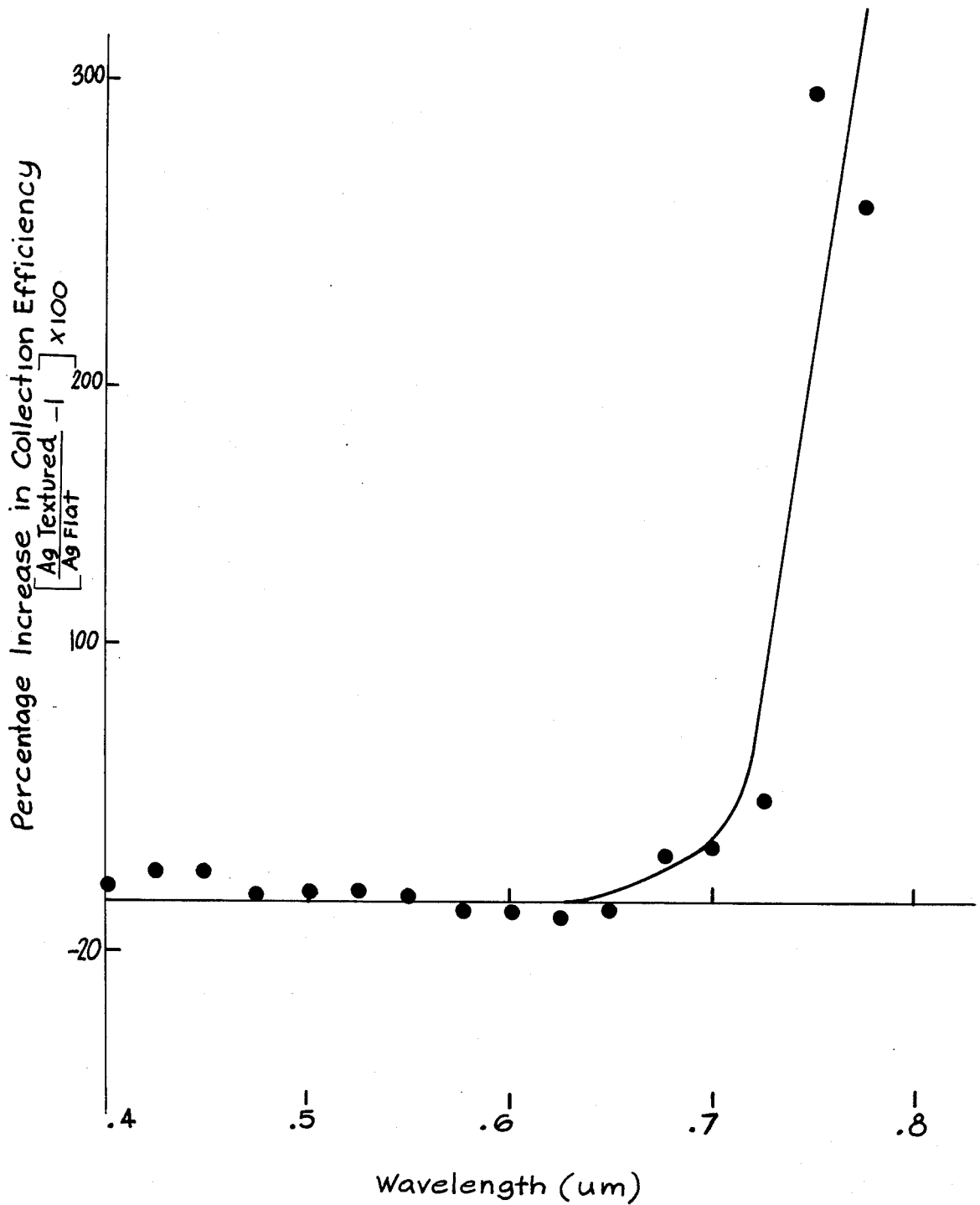
FIG. 9 shows a graph of the enhancement as a function of wavelength for a solar cell constructed according to the embodiment shown in FIG. 3. Increase in the percentage difference in collection efficiency significantly above 0% is due to optical enhancement.

FIG. 9 shows the percentage increase in the collection efficiency due to texturing. It should be noted that in this case substantial differences between flat and textured cells only exist for wavelengths longer than 725 nm. This is due to the fact that the cell material had a smaller optical bandgap than the material described in Examples 1 and 2. Due to the smaller bandgap, the optical enhancement effects shift to longer wavelength where the light is weakly absorbed.

EXAMPLE 4

Figure 14:
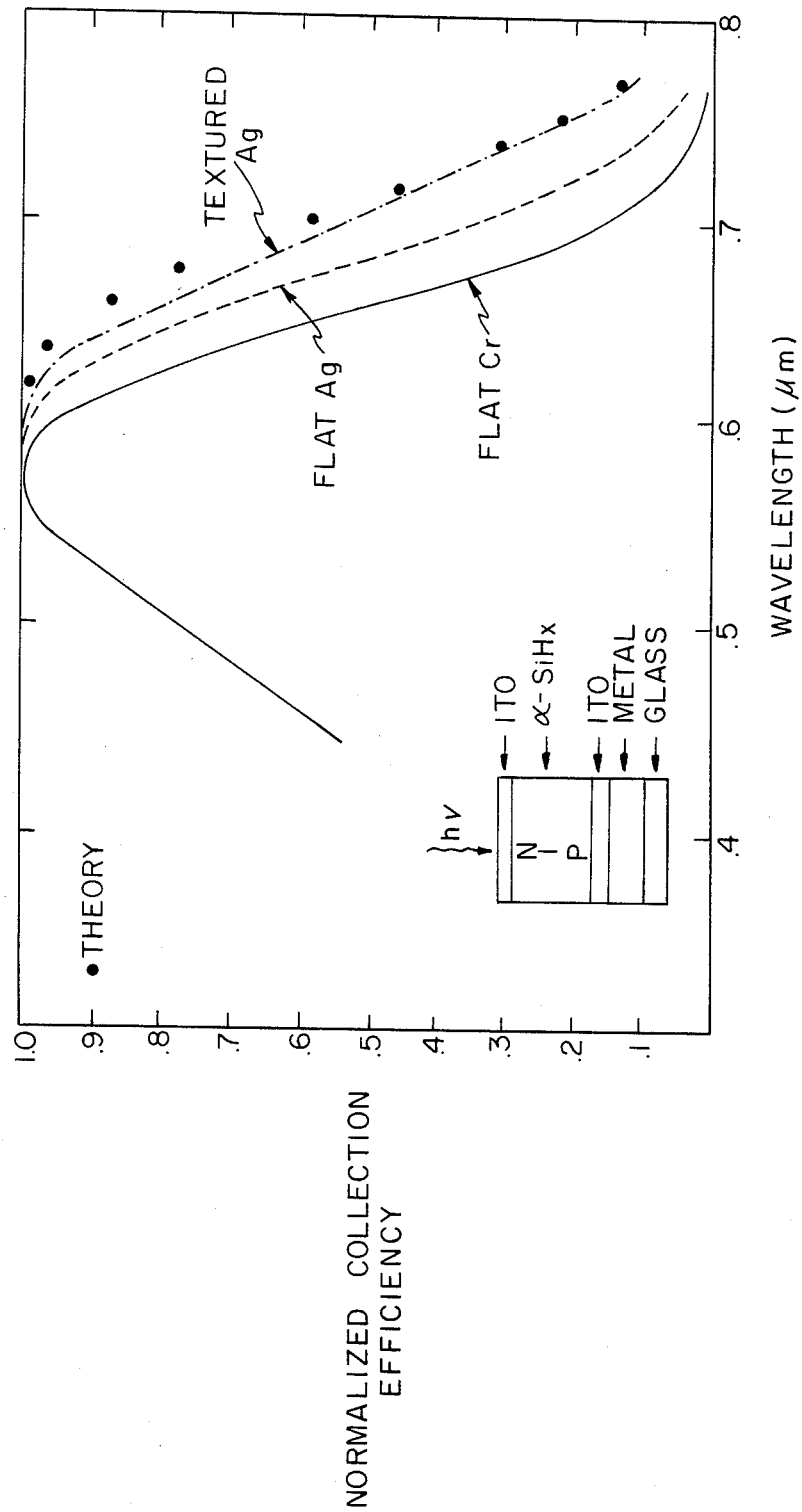
FIG. 14 shows the collection efficiency spectra for a 0.7 micron thick PIN a-SiH$_x$ solar cell.

The method shown in FIG. 3 was used to prepare optically enhanced a-SiH$_x$ solar cells. Steps a, b and c of Example 3 were repeated and the samples was affixed to the cathode of a plasma reactor and a 7,500A thick PIN a-SiH$_x$ solar cell structure was deposited. Following this, 2 mm$^2$ solar cells were formed using the method in step e of example 3. The collection width for carriers in the flat cell was determined from the shape of the collection efficiency spectra shown in FIG. 14. In this case, the carrier collection width was nearly equal to the cell thickness and the shape of the spectral response curve was unaffected by application of bias light and bias voltage. These results indicate that carrier collection was obtained from virtually the entire I layer thickness and the quantum efficiency for collection of carriers in textured cells is proportional to the enhanced absorption probability. The enhanced optical absorption probability can be determined from independent measurements of the performance of the texture and parasitic optical absorption in the reflector structure. The cell having a textured silver reflector shown in FIG. 14 was studied with photothermal diflectioon spectroscopy and found to have a randomization fraction ($\beta = 1$) and parasitic optical absorption of 0.22. The theoretical points shown in FIG. 14 correspond to the calculated carrier collection efficiency using these optical measurements. It is seen that a close agreement exists between the measured collection efficiency spectra and those calculated from independent optical measurements. The improved infrared response of the quantum collection efficiency results in a increase of short circuit current in the cell with the textured silver reflector of 2.3 mA/cm$^2$ for a AM1 solar spectrum.

What is claimed is:

1. A method for producing an optically enhanced thin film photovoltaic semiconductor device having electrical contacts to carry current from said device comprising:
   a. producing an active layer of semiconductor material wherein the surface of at least one side of said active layer is textured such that said surface includes randomly spaced, densely packed microstructures of predetermined dimensions of the order of the wavelength of visible light in said semiconductor material, said microstructure being microcolumnar posts having a predetermined profile such that said texture of said active layer results in optically enhancement by incoherent scattering with a randomization fraction, $\beta$, greater than 0.75;
   b. forming a reflecting surface directly to either side of said semiconductor material and making an ohmic contact to said material such that the parasitic optical absorption in said electrical contacts and said reflecting surface are less than $1/n^2$, where n is the semiconductor index of refraction, such that the enhancement factor, E, for optical absorption within the active layer of the semiconductor material and the quantum efficiency of collection of photogenerated carriers in increased by a factor greater than 1.5 $n^2$.

2. The method of claim 1 wherein said optical absorption increase is within 90% of the full measure of light trapping allowed by statistical mechanics.

3. The method of claim 1 wherein said active layer has a thickness $\leq$ carrier collection width.

4. The method of claim 1 for producing an optically enhanced thin film photovoltaic device wherein said step of producing an active layer of semiconductor material comprises:
   a. producing a textured surface on a transparent conductor, wherein said textured surface includes randomly spaced, densely packed microstructures of predetermined dimensions of the order of the wavelength of visible light in said semiconductor material; and
   b. forming said active layer of semiconductor material on said transparent conductor, forming an ohmic contact, said material conforming to the shape of said textured transparent conductor.

5. The method of claim 4 for producing an optically enhanced thin film photovoltaic device wherein said step for producing a textured surface comprises:
   a. depositing a transparent conductor on a flat light transparent substrate;
   b. texturing said transparent conductor.

6. The method of claim 5 for producing an optically enhanced thin film photovoltaic device wherein said semiconductor material is amorphous silicon hydride.

7. The method of claim 6 for producing an optically enhanced thin film photovoltaic device wherein said photovoltaic device is a PIN solar cell.

8. The method of claim 4 for producing an optically enhanced thin film photovoltaic device comprising:
   a. texturing one side of transparent substrate;
   b. attaching a transparent conductor on said textured surface of said light transparent substrate, said transparent conductor conforming to the shape of said textured surface.

9. The method of claim 1 for producing an optically enhanced thin film photovoltaic device wherein said texturing step is performed by lithographic techniques.

10. The method of claim 9 for producing an optically enhanced thin film photovoltaic device wherein said lithographic technique includes a lithographic mask composed of colloidal particles with sizes ranging from 2,000 A to 10,000 A.

11. A method for producing an optically enhanced thin film photovoltaic semiconductor device comprising:
   a. producing a textured surface on a substrate, wherein said textured surface includes randomly spaced, densely packed microstructures of predetermined dimensions of the order of the wavelength of visible light in the semiconductor material of said device, said microstructures being microcolumnar posts having a predetermined profile, such that said texture of said active layer results in optical enhancement by incoherent scattering;
   b. forming a reflecting surface on said substrate, said reflecting surface conforming to the shape of said textured substrate such that the parasitic optical absorption in said diffusion barrier is less than $5/n^2$, where n is the semiconductor index of refraction.
   c. forming a conducting transparent diffusion barrier to said reflecting surface, said diffusion barrier conforming to the shape of said reflecting surface;
   d. depositing semiconductor material on said diffusion barrier forming an ohmic contact, such that the parasitic optical absorption in said contact is less than $5/n^2$ where n is the semiconductor index of refraction, said semiconductor material conforming to the shape of said diffusion barrier, and;
   e. attaching a transparent ohmic contact to said semiconductor material on the side away from said substrate such that the parasitic optical absorption in said diffusion barrier is less than $5/n^2$, where n is the semiconductor index of refraction.

12. The method of claim 11 for producing an optically exhanced thin film photovoltaic device wherein said texturing step is performed by lithographic techniques.

13. The method of claim 12 for producing an optically enhanced thin film photovoltaic device wherein said lithographic technique includes a lithographic mask comprised of colloidal particles.

14. The method of claim 11 for producing an optically enhanced thin film photovoltaic device wherein said semiconductor material is amorphous silicon.

15. The method of claim 11 for producing an optically enhanced thin film photovoltaic device wherein said photovoltaic device is a PIN solar cell.

* * * * *